United States Patent
Aratono et al.

(10) Patent No.: US 9,435,831 B2
(45) Date of Patent: Sep. 6, 2016

(54) CURRENT SENSOR

(71) Applicant: ALPS GREEN DEVICES CO., LTD., Tokyo (JP)

(72) Inventors: Mitsuo Aratono, Niigata-ken (JP); Masahiro Iizuka, Niigata-ken (JP); Masamichi Saito, Niigata-ken (JP); Akira Takahashi, Niigata-ken (JP); Shigenobu Miyajima, Niigata-ken (JP); Kenji Ichinohe, Niigata-ken (JP); Yoshihiro Nishiyama, Niigata-ken (JP); Yosuke Ide, Niigata-ken (JP); Shinji Mitsuya, Niigata-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 771 days.

(21) Appl. No.: 13/905,049

(22) Filed: May 29, 2013

(65) Prior Publication Data

US 2013/0249531 A1 Sep. 26, 2013

Related U.S. Application Data

(63) Continuation of application No. PCT/JP2011/076733, filed on Nov. 18, 2011.

(30) Foreign Application Priority Data

Dec. 2, 2010 (JP) ................................ 2010-269175

(51) Int. Cl.
*G01R 19/00* (2006.01)
*B82Y 25/00* (2011.01)
*G01R 15/20* (2006.01)

(52) U.S. Cl.
CPC ........... *G01R 19/0092* (2013.01); *B82Y 25/00* (2013.01); *G01R 15/205* (2013.01); *G01R 15/207* (2013.01)

(58) Field of Classification Search
CPC G01R 19/0092; G01R 15/148; G01R 21/08; H02M 2001/0009
See application file for complete search history.

(56) References Cited

U.S. PATENT DOCUMENTS

| 4,625,166 | A | * | 11/1986 | Steingroever | .......... G01R 33/07 324/117 H |
| 7,312,609 | B2 | * | 12/2007 | Schmollngruber | .... B82Y 25/00 324/207.21 |
| 7,355,381 | B2 | | 4/2008 | Noel | |
| 7,821,253 | B2 | * | 10/2010 | Serpinet | ............... G01R 15/207 324/117 R |
| 2006/0012459 | A1 | | 1/2006 | Lenssen | |

FOREIGN PATENT DOCUMENTS

| JP | 11-237411 | 8/1999 |
| JP | 2002-156390 | 5/2002 |
| JP | 2007-107972 | 4/2007 |

OTHER PUBLICATIONS

Search Report dated Jan. 24, 2012 from International Application No. PCT/JP2011/076733.

* cited by examiner

*Primary Examiner* — Jermele M Hollington
*Assistant Examiner* — Dustin Dickinson
(74) *Attorney, Agent, or Firm* — Beyer Law Group LLP

(57) ABSTRACT

A current sensor includes a magnetic sensor module including a plurality of magnetic sensor units connected in series. The magnetic sensor units each include a first magnetic sensor element and a second magnetic sensor element which have sensitivity axes oriented in opposite directions. A first terminal of the first magnetic sensor unit is connected to a first potential source. A third terminal of the first magnetic sensor unit is connected to a second potential source. A second terminal and a fourth terminal of the last magnetic sensor unit are connected to constitute a sensor output terminal. The first terminal of each of the magnetic sensor units excluding the first magnetic sensor unit is connected to the second terminal of the next magnetic sensor unit and the third terminal thereof is connected to the fourth terminal of the next magnetic sensor unit.

12 Claims, 14 Drawing Sheets

8-SENSOR

4-SENSOR

8-SENSOR

4-SENSOR

CURRENT SENSOR

CLAIM OF PRIORITY

This application is a Continuation of International Application No. PCT/JP2011/076733 filed on Nov. 18, 2011, which claims benefit of Japanese Patent Application No. 2010-269175 filed on Dec. 2, 2010. The entire contents of each application noted above are hereby incorporated by reference.

BACKGROUND OF THE INVENTION

1. Field of the Invention

The present invention relates to a current sensor capable of measuring target current in a contactless manner.

2. Description of the Related Art

In the field of motor drive technology for electric vehicles and hybrid cars, relatively large current is used. Current sensors capable of measuring large current in a contactless manner are required for such purpose. Current sensors recently developed include a current sensor that allows magnetic sensors to detect a change in magnetic field caused by target current. For example, Japanese Unexamined Patent Application Publication No. 2002-156390 discloses a current sensor that includes magnetoresistive elements as elements for magnetic sensors.

In the above-described contactless current sensor, since the magnetic sensors detect a change in magnetic field caused by target current, slight displacement of installation positions of the magnetic sensors relative to a current line through which the target current flows may result in a large measurement error. The current sensor including the magnetic sensors therefore has to be positioned relative to the current line through which the target current flows with high installation accuracy.

As the accuracy of installation of the current sensor relative to the current line is increased, however, ease of installation of the current sensor is reduced. In the contactless current sensor, therefore, it is difficult to maintain the ease of installation and high accuracy of current measurement.

SUMMARY OF THE INVENTION

The present invention has been made in consideration of the above-described circumstances and provides a current sensor that maintains high accuracy of current measurement and permits the accuracy of installation relative to a current line through which target current flows to be relaxed.

An aspect of the present invention provides a current sensor including at least one magnetic sensor module that includes a plurality of magnetic sensor units connected, the magnetic sensor units each including a first magnetic sensor element and a second magnetic sensor element. The magnetic sensor units each include a first terminal connected to a first end of the first magnetic sensor element, a second terminal connected to a second end of the first magnetic sensor element, a third terminal connected to a first end of the second magnetic sensor element, and a fourth terminal connected to a second end of the second magnetic sensor element. The first terminal of the first magnetic sensor unit corresponding to a first end of the magnetic sensor module is connected to a first potential source. The third terminal of the first magnetic sensor unit is connected to a second potential source. The second terminal and the fourth terminal of the last magnetic sensor unit corresponding to a second end of the magnetic sensor module are connected to constitute a sensor output terminal. The first terminal of each of the magnetic sensor units excluding the first magnetic sensor unit is connected to the second terminal of the next magnetic sensor unit adjacent to the first magnetic sensor unit and the third terminal thereof is connected to the fourth terminal of the next magnetic sensor unit adjacent to the first magnetic sensor unit. The plurality of first magnetic sensor elements are electrically connected in series and the plurality of second magnetic sensor elements are electrically connected in series. A sensitivity axis of each first magnetic sensor element and a sensitivity axis of each second magnetic sensor element are oriented in opposite directions. The sensitivity axes of the first magnetic sensor elements and the sensitivity axes of the second magnetic sensor elements are arranged along the circumferences of concentric circles.

In this configuration, the sensitivity axes of the magnetic sensor elements are arranged along the circumferences of the concentric circles. Accordingly, the current sensor can measure an induced magnetic field while surrounding a current line through which target current flows during current measurement and calculate the current on the basis of measurements. This configuration enables the influence of displacement relative to the current line on one magnetic sensor unit to be canceled out by the other magnetic sensor units. If the accuracy of installation of the current sensor relative to the current line is not high, therefore, high-accuracy current measurement can be achieved. In other words, the current sensor that maintains high accuracy of current measurement and permits the accuracy of installation relative to a current line through which target current flows to be relaxed can be provided.

In the current sensor according to this aspect, the at least one magnetic sensor module may include a single magnetic sensor module including the plurality of magnetic sensor units equiangularly spaced with respect to the center of the concentric circles. The number of magnetic sensor units included in the magnetic sensor module may be greater than or equal to four. The number of magnetic sensor units included in the magnetic sensor module may be an even number. In such a configuration, the influence of displacement relative to the current line can be more preferably canceled out, so that higher accuracy of current measurement can be maintained.

In the current sensor according to this aspect, the at least one magnetic sensor module may include a plurality of magnetic sensor modules each including the plurality of magnetic sensor units, the magnetic sensor units being equiangularly spaced with respect to the center of the concentric circles. The total number of magnetic sensor units included in the plurality of magnetic sensor modules may be greater than or equal to four. The total number of magnetic sensor units included in the plurality of magnetic sensor modules may be an even number. In such a configuration, the influence of displacement relative to the current line can be more preferably canceled out, so that higher accuracy of current measurement can be achieved.

In the current sensor according to this aspect, the plurality of magnetic sensor units may be arranged on the same circle. In this configuration, since the magnetic sensor units are aligned, the influence of displacement relative to the current line can be substantially canceled out, so that higher accuracy of current measurement can be achieved.

In the current sensor according to this aspect, the first magnetic sensor element and the second magnetic sensor element may have substantially the same absolute value of sensitivity in each magnetic sensor unit. Furthermore, each"

of the magnetic sensor units may have a single chip structure such that the first magnetic sensor element and the second magnetic sensor element are arranged in a single substrate. In this configuration, since sensitivity variations between the first and second magnetic sensor elements in each magnetic sensor unit are reduced, higher accuracy of current measurement can be achieved.

In the current sensor according to this aspect, each of the first and second magnetic sensor elements may include a giant magnetoresistive (GMR) element.

In the current sensor according to this aspect, a current line through which target current flows may be disposed at the center of the concentric circles.

DESCRIPTION OF THE PREFERRED EMBODIMENTS

In a current sensor that measures current in a contactless manner, if the position of the current sensor is slightly displaced relative to a current line, a large measurement error will be caused. The reason is that the strength of a magnetic field applied to a magnetic sensor element in the current sensor is determined on the basis of a parameter indicating a distance from target current which serves as a source of the magnetic field. As the distance between the magnetic sensor element and the target current decreases, the magnetic field increases. Accordingly, a measurement indicated by the current sensor shifts in a positive direction. As the distance between the magnetic sensor element and the target current increases, the magnetic field decreases. Accordingly, a measurement indicated by the current sensor shifts in a negative direction.

The inventors have focused on the above fact and have thought that a current sensor is configured so that fluctuations of characteristics of magnetic sensor elements caused by an induced magnetic field can be added in the vicinity of target current, an influence in the positive direction and an influence in the negative direction are canceled out to reduce the influence of displacement, and high accuracy of current measurement can therefore be maintained. Specifically, the concept of the present invention is that arrangement of a plurality of magnetic sensor elements along the circumferences of concentric circles so as to surround an axis in which a current line, through which target current flows, is disposed allows high accuracy of current measurement to be maintained, the influence of displacement to be reduced, and requirements for the accuracy of installation of a current sensor to be relaxed. Embodiments will be described in detail below with reference to the drawings.

First Embodiment

Figure 1:
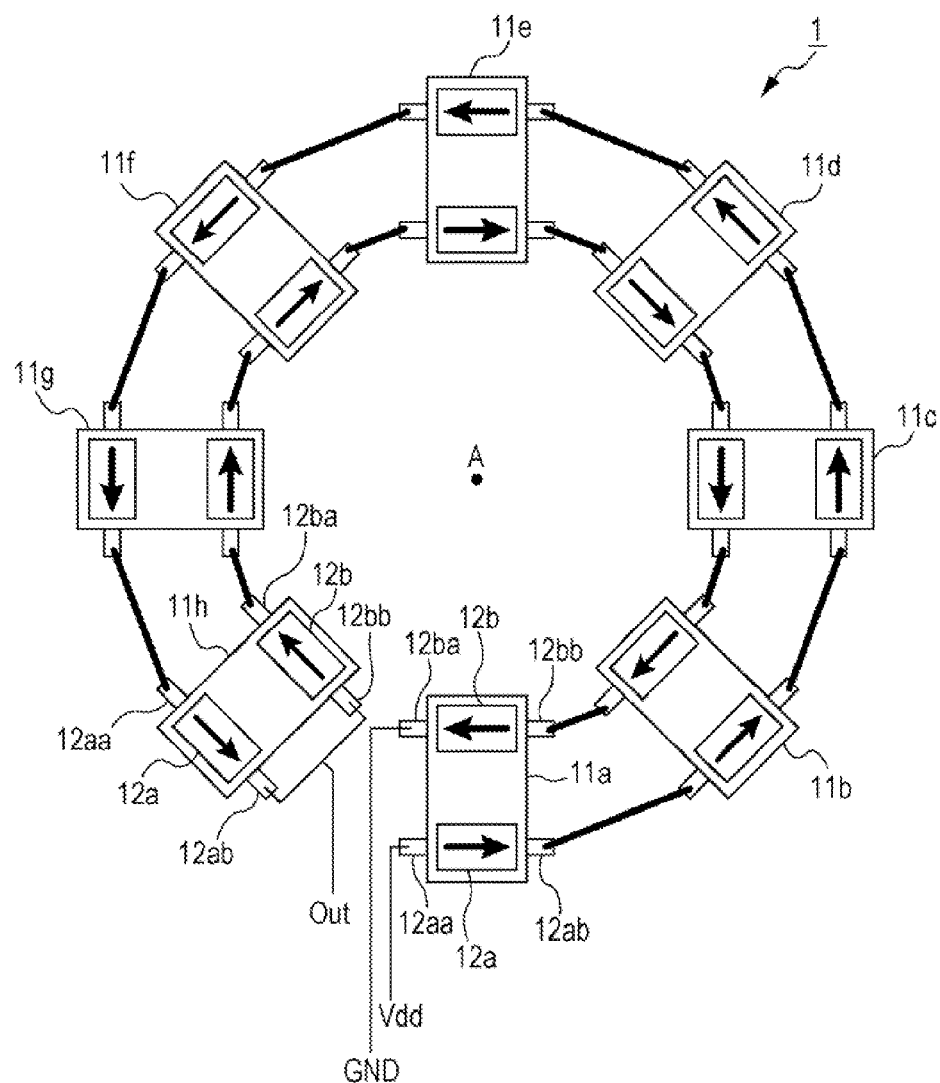
FIG. 1 is a schematic diagram illustrating an exemplary configuration of a current sensor according to a first embodiment.

A first embodiment will be described with respect to a current sensor that includes a single magnetic sensor module including a plurality of magnetic sensor units. FIG. 1 is a schematic plan view of a current sensor according to the present embodiment. A current sensor 1 in FIG. 1 includes a single magnetic sensor module including magnetic sensor units 11a, 11b, 11c, 11d, 11e, 11f, 11g, and 11h arranged in positions corresponding to the vertices of a regular octagon in plan view. Although FIG. 1 illustrates a configuration in which eight magnetic sensor units are arranged in eight positions corresponding to the vertices of the regular octagon, specifically, the eight magnetic sensor units are arranged on concentric circles, the configuration of the current sensor is not limited to this configuration. The number of magnetic sensor units may be more than one. Furthermore, the magnetic sensor units may be arranged so as to surround at least one point (an axis or center) in plan view. For example, the magnetic sensor units may be arranged on the vertices of a polygon (not limited to any regular polygon) or a circumference in pan view.

In the current sensor 1, a current line (not illustrated) through which target current flows is disposed in the vicinity of a point A (axis A) positioned substantially equidistant from the magnetic sensor units 11a to 11h in plan view such that the current line extends in a direction into the drawing sheet. In other words, assuming that the magnetic sensor units 11a to 11h are projected in a plane perpendicular to a direction in which the target current flows (or the direction in which the current line extends), the magnetic sensor units 11a to 11h are arranged in positions corresponding to the vertices of a regular octagon, the positions being substantially equidistant from the point A (axis A). The point A corresponds to the center of the concentric circles on which the magnetic sensor units 11a to 11h are arranged in plan view. The position of the current line is not limited to this position. In the current sensor 1 according to this embodiment, requirements for the relative positional relationship between the current line and the current sensor 1 (or the magnetic sensor units 11a to 11h) are relaxed. In other words, restrictions on the positional relationship between the current line and the current sensor 1 (or the magnetic sensor units 11a to 11h) are reduced, thus increasing the flexibility of arrangement. Accordingly, the current line may be disposed in a position deviated from the point A (axis A). In order to achieve the effect of reducing the influence of displacement, it is desirable to dispose the current line in an area surrounded by the magnetic sensor units 11a to 11h in plan view.

The magnetic sensor units 11a to 11h may be arranged in any positions in the direction into the drawing sheet (the direction in which the target current flows or the direction in which the current line extends). The influence of displacement can be compensated for so long as the above-described positional relationship is established in the plane perpendicular to the direction in which the target current flows. In other words, the arrangement of the magnetic sensor units 11a to 11h is not limited to that in the same plane. For example, the magnetic sensor units 11a to 11h may be arranged spirally about the current line. In the following description, it is assumed that the arrangement of components projected on a plane perpendicular to the direction in which the target current flows is viewed in plan view, except as specially mentioned.

The magnetic sensor units 11a to 11h each include a magnetic sensor element (first magnetic sensor element) 12a and a magnetic sensor element (second magnetic sensor element) 12b which have sensitivity axes oriented in opposite directions. Examples of the magnetic sensor element include a magnetoresistive element and a Hall element. Particularly, it is desirable to use a magnetoresistive element, such as a GMR element.

In this case, the sensitivity axes of the magnetic sensor elements 12a are oriented counterclockwise along the circumferences of the concentric circles. Furthermore, the sensitivity axes of the magnetic sensor elements 12b are oriented clockwise along the circumferences of the concentric circles. In order to effectively measure the target current, it is desirable that the sensitivity axes of the magnetic sensor elements 12a and those of the magnetic sensor elements 12b be oriented parallel to a magnetic field induced by the target current in the above-described manner. Specifically, it is desirable to orient the sensitivity axes of the magnetic sensor elements 12a and 12b in a tangential direction of a circumference formed by the magnetic sensor units 11a to 11h. Note that the orientations of the sensitivity axes of the magnetic sensor elements 12a and 12b are not limited to this pattern. The target current can be measured unless the sensitivity axes of the magnetic sensor elements 12a and 12b are oriented in a direction perpendicular to the magnetic field induced by the target current.

In the current sensor 1, a first end (not illustrated) of the magnetic sensor element (first magnetic sensor element) 12a in the magnetic sensor unit (first magnetic sensor unit) 11a is connected to a terminal 12aa (first terminal) of the magnetic sensor unit 11a. The terminal 12aa is connected to a potential source that applies a power supply potential Vdd (first potential). A first end (not illustrated) of the magnetic sensor element (second magnetic sensor element) 12b in the magnetic sensor unit 11a is connected to a terminal 12ba (third terminal) of the magnetic sensor unit 11a. The terminal 12ba is connected to a potential source that applies a ground potential GND (second potential). In the magnetic sensor unit (last magnetic sensor unit) 11h next to the magnetic sensor unit 11a, a second end (not illustrated) of the magnetic sensor element (first magnetic sensor element) 12a is connected to a terminal 12ab (second terminal) of the magnetic sensor unit 11h. A second end (not illustrated) of the magnetic sensor element (second magnetic sensor element) 12b is connected to a terminal 12bb (fourth terminal) of the magnetic sensor unit 11h. The terminals 12ab and 12bb of the magnetic sensor unit 11h are electrically connected to constitute an output terminal that outputs a sensor output Out.

In the current sensor 1, all of the magnetic sensor elements (first magnetic sensor elements) 12a each having the sensitivity axis oriented counterclockwise are connected in series. In addition, all of the magnetic sensor elements (second magnetic sensor elements) 12b each having the sensitivity axis oriented clockwise are connected in series. More specifically, the terminal 12aa (the first end of the magnetic sensor element (first magnetic sensor element) 12a) in any magnetic sensor unit is electrically connected to the terminal 12ab (the second end of the magnetic sensor element (first magnetic sensor element) 12a) in the next magnetic sensor unit. In addition, the terminal 12ba (the first end of the magnetic sensor element (second magnetic sensor element) 12b) in any magnetic sensor unit is electrically connected to the terminal 12bb (the second end of the magnetic sensor element (second magnetic sensor element) 12b) in the next magnetic sensor unit. Note that the terminals connected to the potential sources and the terminals constituting the output terminal are eliminated from the above-described connection relationship.

Specifically, the first end (corresponding to the terminal 12aa) of the magnetic sensor element 12a in the magnetic sensor unit 11a is electrically connected to the first end (corresponding to the terminal 12ba) of the magnetic sensor element 12b in the magnetic sensor unit 11a through the other magnetic sensor units, thus forming a closed circuit. The closed circuit is a half bridge circuit. The half bridge circuit can output a sensor output Out indicating a potential that reflects a voltage drop across each magnetic sensor element. Accordingly, the sensor output Out that reflects characteristic fluctuations of the magnetic sensor elements caused by an induced magnetic field can be obtained. Consequently, the target current can be calculated on the basis of the sensor output Out.

Figure 2:
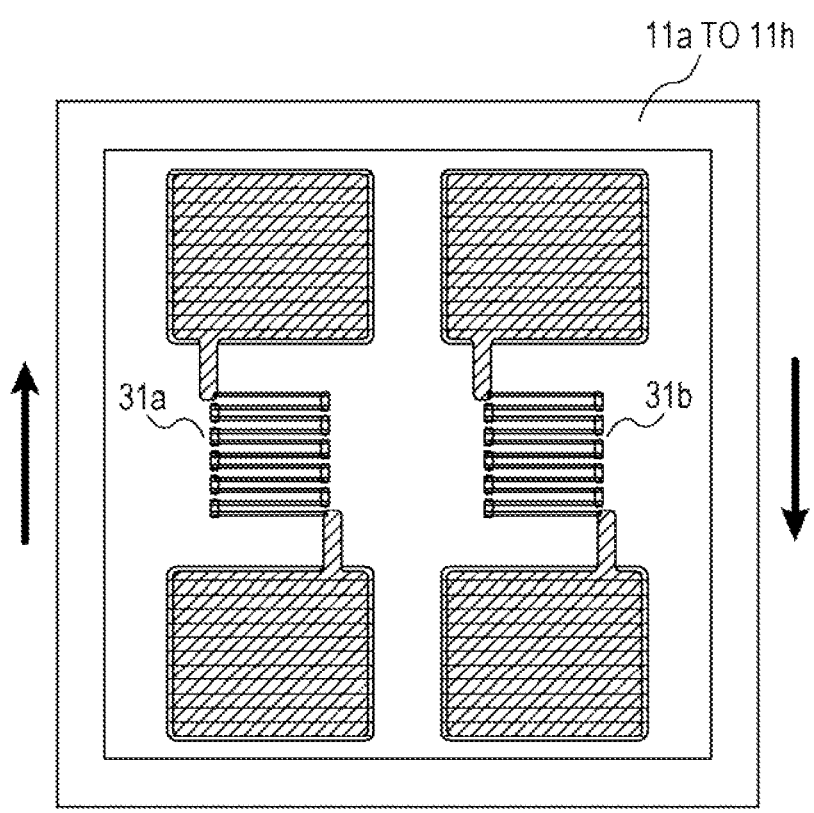
FIG. 2 is a schematic diagram illustrating an exemplary configuration of a magnetic sensor unit according to the first embodiment.

In the case where the magnetic sensor element 12a and the magnetic sensor element 12b each include a magnetoresistive element, it is desirable that the magnetic sensor units 11a to 11h each have a single chip structure which includes a magnetoresistive element 31a and a magnetoresistive element 31b, serving as the magnetic sensor elements 12a and 12b, respectively, arranged in a single substrate as illustrated in FIG. 2. The arrangement of the magnetoresistive elements 31a and 31b in the same substrate reduces variations (e.g., a sensitivity variation) between the magnetoresistive elements 31a and 31b, thus increasing the accuracy of current measurement. As illustrated in FIG. 2, each of the magnetoresistive elements 31a and 31b is shaped in a meandering pattern in plan view.

Figure 3A:
FIGS. 3A to 3C are diagrams explaining a method of making magnetoresistive elements according to the first embodiment.
Figure 3B:
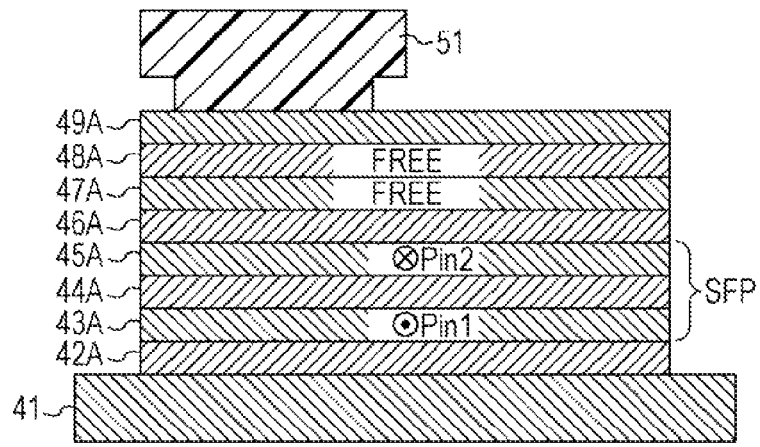
Figure 3C:
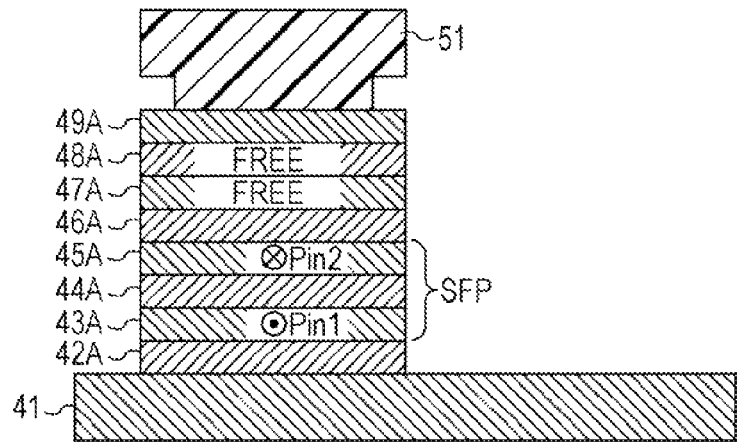

FIGS. 3A to 3C and FIGS. 4A to 4C are schematic sectional views explaining a method of making the magnetoresistive elements which serve as the magnetic sensor elements 12a and 12b and have sensitivity axes oriented in opposite directions (different from each other by 180°). First, as illustrated in FIG. 3A, a substrate 41 is overlaid in sequence with a seed layer 42A, a first ferromagnetic film 43A, an antiparallel coupling film 44A, a second ferromagnetic film 45A, a nonmagnetic interlayer 46A, soft magnetic free layers (free magnetic layers) 47A and 48A, and a protective layer 49A. During formation of each of the first ferromagnetic film 43A and the second ferromagnetic film 45A, a magnetic field is applied to the layer in a direction along the width of each stripe of the meandering pattern in the magnetoresistive element. In FIGS. 3A to 3C, the direction of the magnetic field applied to the first ferromagnetic film 43A is a direction out of the drawing sheet and the direction of the magnetic field applied to the second ferromagnetic film 45A is a direction into the drawing sheet. During formation of each of the soft magnetic free layers (free magnetic layers) 47A and 48A, the magnetic field is applied to the layer in a direction along the length of each stripe of the meandering pattern in the magnetoresistive element.

Subsequently, as illustrated in FIG. 3B, a resist material is deposited on the protective layer 49A. A resist layer 51 is then formed in an area for formation of one magnetoresistive element by photolithography and etching. After that, as illustrated in FIG. 3C, the exposed laminated layers are removed by, for example, ion milling, thus exposing the substrate 41 in an area for formation of the other magnetoresistive element.

Figure 4A:
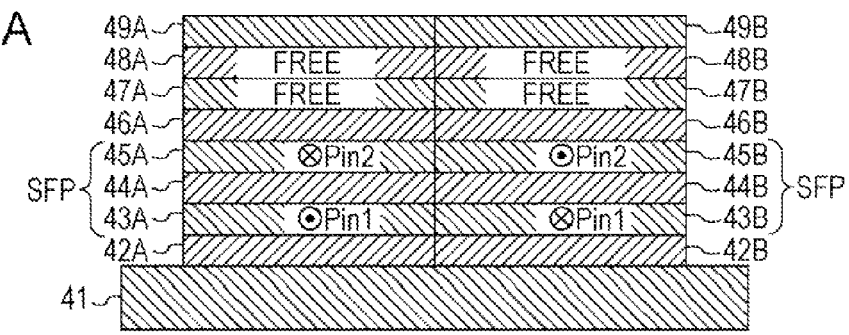
FIGS. 4A to 4C are diagrams explaining the method of making the magnetoresistive elements according to the first embodiment.
Figure 4B:
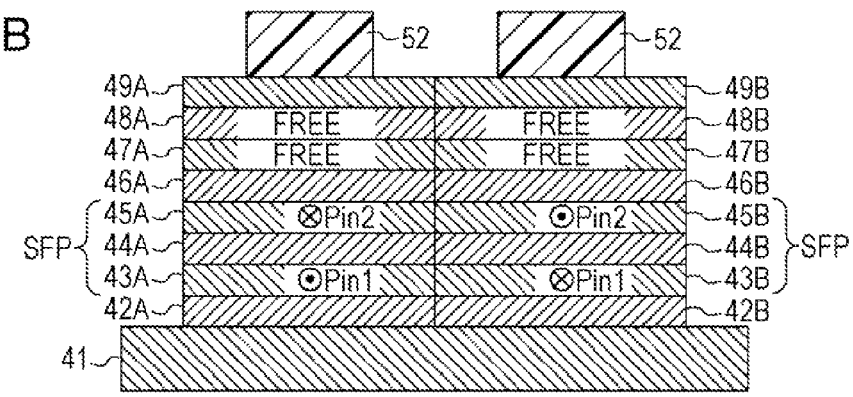
Figure 4C:
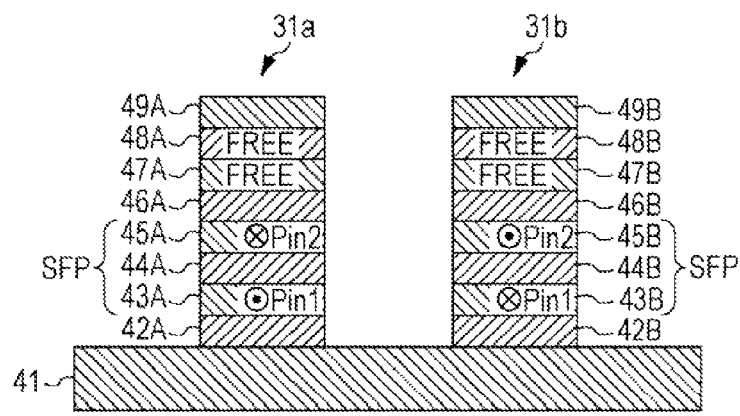

Subsequently, as illustrated in FIG. 4A, the exposed substrate 41 is overlaid in sequence with a seed layer 42B, a first ferromagnetic film 43B, an antiparallel coupling film 44B, a second ferromagnetic film 45B, a nonmagnetic interlayer 46B, soft magnetic free layers (free magnetic layers) 47B and 48B, and a protective layer 49B. During formation of each of the first ferromagnetic film 43B and the second ferromagnetic film 45B, the magnetic field is applied to the layer in the direction along the width of each stripe of the meandering pattern in the magnetoresistive element. In FIGS. 4A to 4C, the direction of the magnetic field applied to the first ferromagnetic film 43B is the direction into the drawing sheet and the direction of the magnetic field applied to the second ferromagnetic film 45B is the direction out of the drawing sheet. During formation of each of the soft magnetic free layers (free magnetic layers) 47B and 48B, the magnetic field is applied to the layer in the direction along the length of each stripe of the meandering pattern in the magnetoresistive element.

Subsequently, as illustrated in FIG. 4B, a resist material is deposited on the protective layer 49A and the protective layer 49B. A resist layer 52 is then formed in each area for formation of the magnetoresistive element by photolithography and etching. After that, as illustrated in FIG. 4C, the exposed laminated layers are removed by, for example, ion milling, thus forming the magnetoresistive elements 31a and 31b.

According to the above-described making method, the magnetized directions in a self-pinned ferromagnetic pinned layer are opposite to each other (or different from each other by 180°) in the two magnetoresistive elements 31a and 31b. Thus, characteristic variations between the two magnetoresistive elements 31a and 31b can be reduced. Accordingly, the use of the magnetoresistive elements 31a and 31b as the magnetic sensor elements 12a and 12b can increase the accuracy of current measurement.

Figure 5:
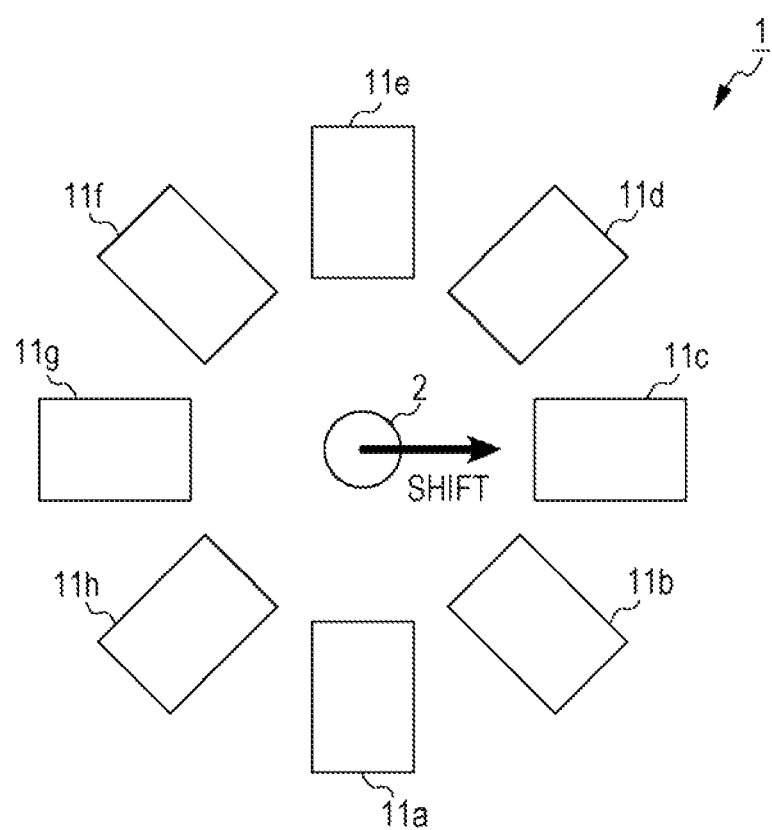
FIG. 5 is a schematic diagram illustrating the positional relationship between the current sensor and a current line.
Figure 6A:
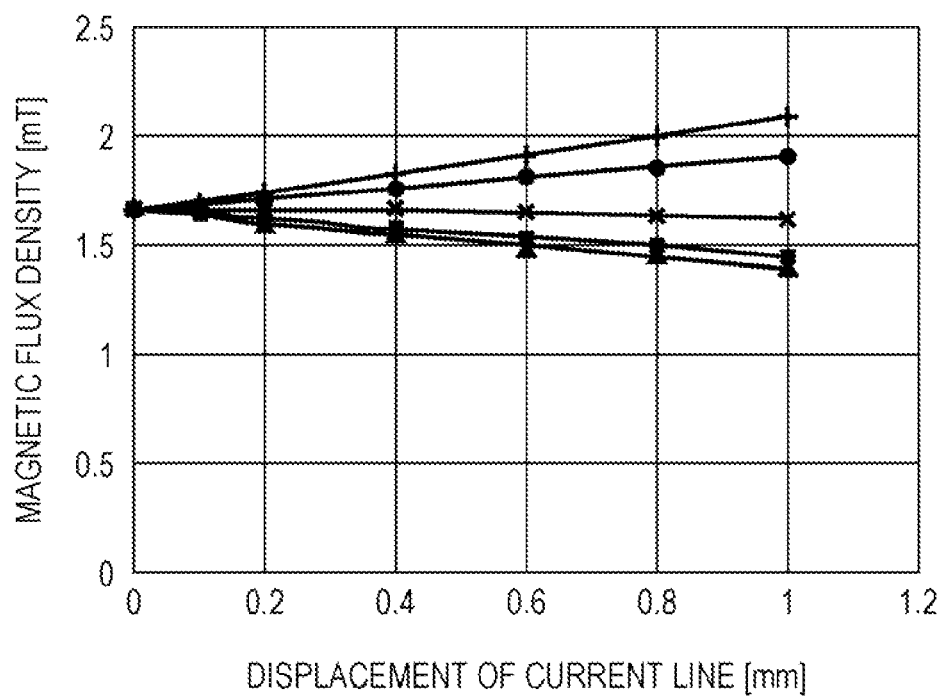
FIG. 6A is a graph illustrating the relationship between a displacement and magnetic flux densities applied to the magnetic sensor units.

FIG. 5 is a schematic diagram illustrating the occurrence of displacement of installation of the current sensor 1 according to this embodiment relative to a current line 2. As illustrated in FIG. 5, it is assumed that the current line 2 is shifted (displaced) from a point (corresponding to the point A in FIG. 1) positioned equidistant from the magnetic sensor units 11a to 11h of the current sensor 1 in a direction (indicated by an arrow in FIG. 5) to the magnetic sensor unit 11c, the point being used as a reference position of the current line 2. FIG. 6A illustrates the relationship between the displacement (mm) from the reference position of the current line 2 and magnetic flux densities (mT) applied to the magnetic sensor units 11a to 11h in this case. Specifically, the magnetic flux densities applied to the magnetic sensor units 11a to 11h considerably change depending on the displacement of the current line. Each of the magnetic sensor units 11a to 11h of the current sensor 1 is positioned at a distance of 10 mm from the reference position (point A in FIG. 1) of the current line 2.

Figure 6B:
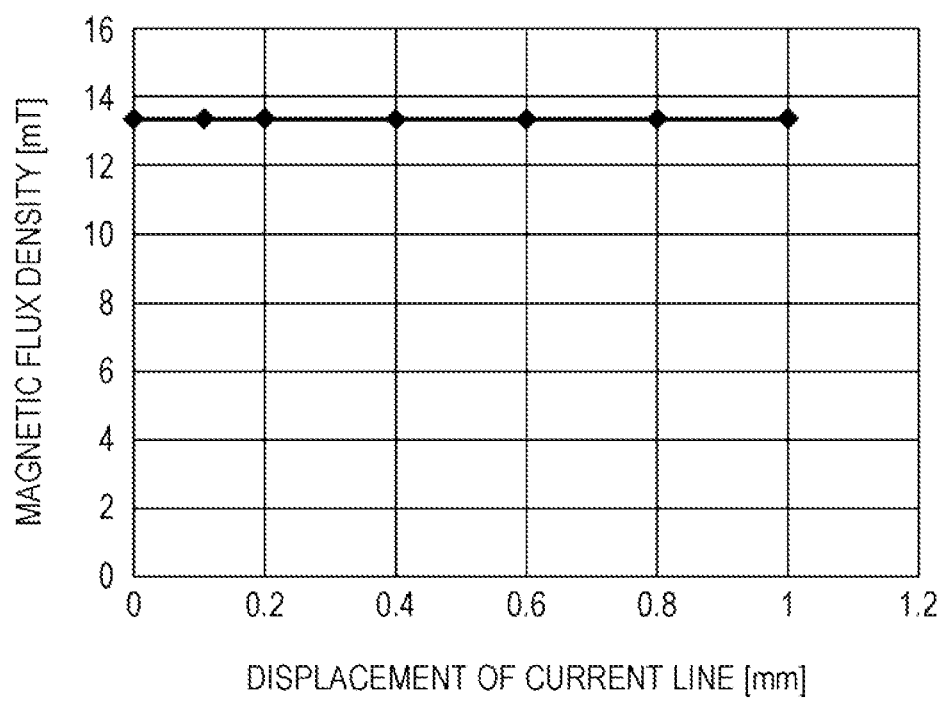
FIG. 6B is a graph illustrating the relationship between the displacement and the sum of magnetic flux densities applied to the magnetic sensor units.

FIG. 6B illustrates the sum (total) of magnetic flux densities applied to the magnetic sensor units 11a to 11h. In this case, the sum of magnetic flux densities applied to the magnetic sensor units 11a to 11h is hardly affected by the displacement of the current line 2. This demonstrates that the bridge circuit formed by the magnetic sensor units arranged around the current line for measurement of the sum of characteristic changes of the magnetic sensor units can substantially reduce the influence of displacement of the current line.

In the current sensor 1 according to this embodiment, since the bridge circuit is formed so that the sum of characteristic changes of the magnetic sensor units is measured as described above, high accuracy of current measurement can be maintained and the accuracy of installation relative to the current line through which the target current flows can be relaxed.

In order to substantially reduce the influence of displacement of the current line, preferably, the magnetic sensor units are arranged in an area where the magnetic flux density applied to each magnetic sensor unit is approximated by a linear function of the distance from the current line. In this area, characteristic fluctuations of the magnetic sensor units caused by displacement can be properly canceled out by characteristic fluctuations of the magnetic sensor units facing each other with the axis A (center axis) therebetween. In order to substantially cancel out the influence of displacement, it is desirable to use three or more magnetic sensor units. The reason is that two magnetic sensor units may fail to compensate for a displacement in a direction perpendicular to the line connecting the two magnetic sensor units. Furthermore, it is desirable to arrange the magnetic sensor units equiangularly with respect to the axis A (center axis) of the current sensor 1. This arrangement can substantially reduce the influence of displacement. Particularly, it is desirable that an even number of magnetic sensor units be arranged such that the magnetic sensor units face each other with the axis A (center axis) of the current sensor 1 therebetween. The arrangement of the magnetic sensor units in this manner can further reduce the influence of displacement. Note that the number of magnetic sensor units is not limited to an even number.

Preferably, the magnetic sensor units are arranged such that any magnetic sensor unit is positioned at a substantially constant distance from the axis A of the current sensor 1.

Consequently, the facing magnetic sensor units appropriately reduce the influence of displacement. The distance does not have to be strictly constant. From similar point of view, it is desirable that the magnetic sensor units be arranged in a pattern of a substantially regular polygon or substantially concentric circles. The arrangement does not have to be strictly in a pattern of a regular polygon or concentric circles. Furthermore, it is desirable to arrange the magnetic sensor units at substantially regular intervals.

FIGS. 7A to 7D are schematic diagrams of the current sensors 1 having different numbers of magnetic sensor units. In the current sensor 1 of FIG. 7A, two magnetic sensor units are arranged with the current line 2 therebetween. In the current sensor 1 of FIG. 7B, four magnetic sensor units are arranged substantially symmetrically with respect to a point corresponding to the current line 2. In the current sensor 1 of FIG. 7C, six magnetic sensor units are arranged substantially symmetrically with respect to the point corresponding to the current line 2. In the current sensor 1 of FIG. 7D, eight magnetic sensor units are arranged substantially symmetrically with respect to the point corresponding to the current line 2.

Figure 7A:
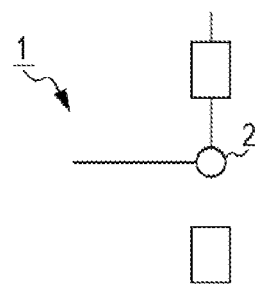
FIGS. 7A to 7D are schematic diagrams of current sensors having different numbers of magnetic sensor units.
Figure 7C:
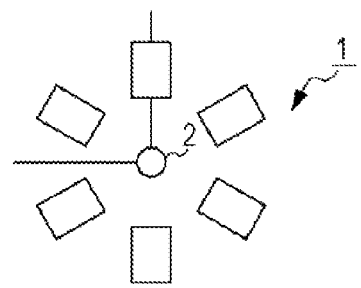
Figure 7B:
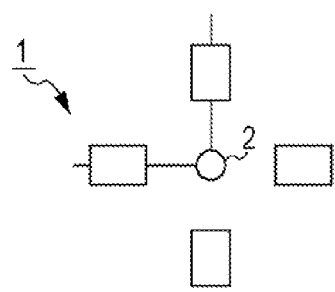
Figure 7D:
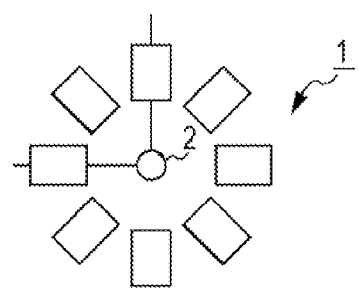
Figure 7E:
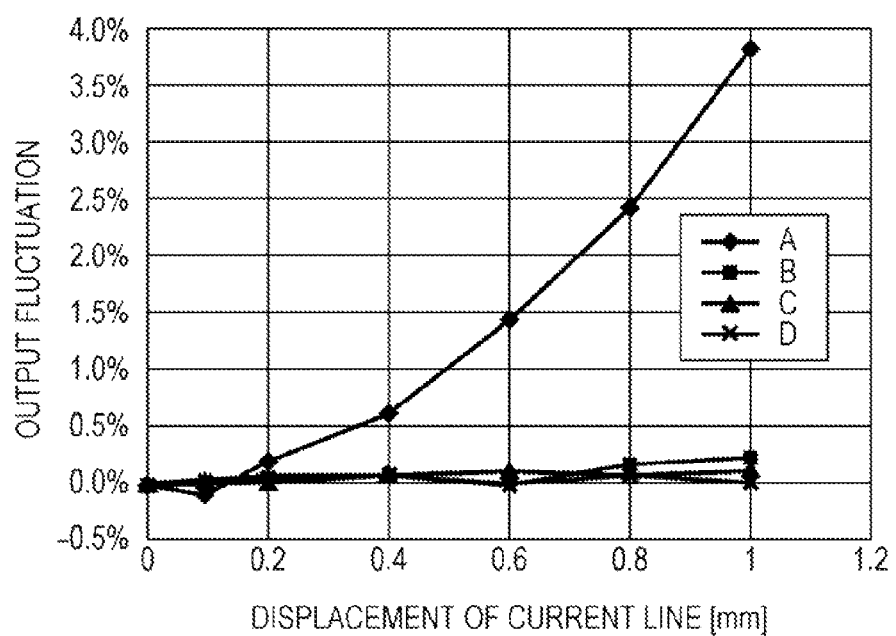
FIG. 7E is a graph illustrating the relationship between a displacement of a current line and a fluctuation in output of each of the current sensors, the results being obtained by computer simulation.

FIG. 7E is a graph illustrating the relationship between a displacement (mm) of the current line and a fluctuation (%) in output of each of the current sensors 1 illustrated in FIGS. 7A to 7D, the results being obtained by computer simulation. FIG. 7E demonstrates that as the number of magnetic sensor units in the current sensor 1 increases, a fluctuation in sensor output can be reduced if the displacement of the current line increases. The results of simulation show that the use of four or more magnetic sensor units is effective.

Figure 8:
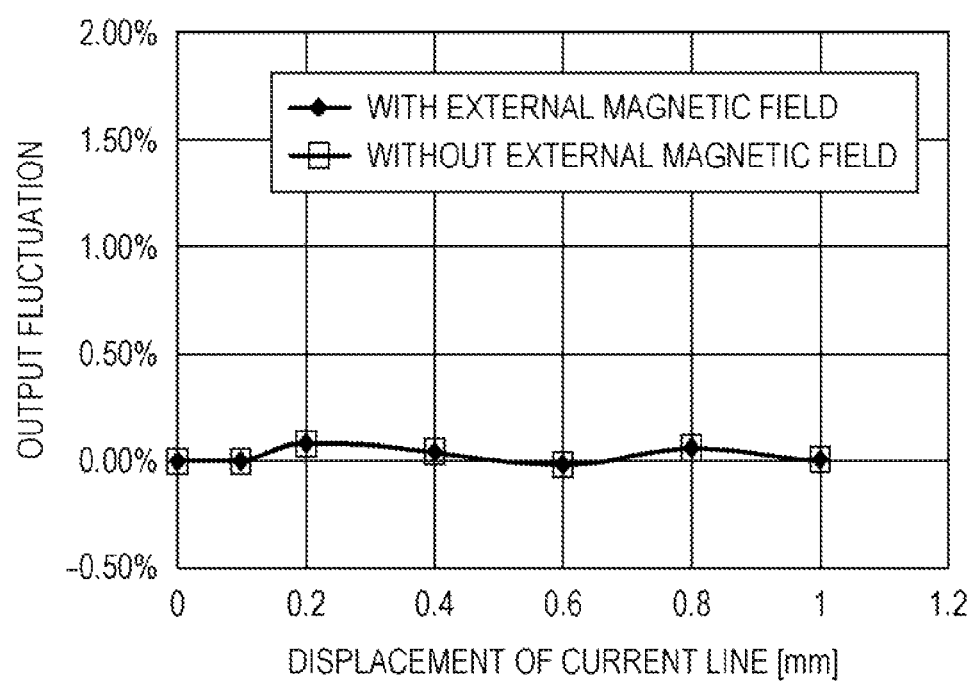
FIG. 8 is a graph illustrating the relationship between the displacement of the current line and the output fluctuation of the current sensor with application of a constant external magnetic field and without application of an external magnetic field, the results being obtained by computer simulation.

FIG. 8 is a graph illustrating the relationship between the displacement (mm) of the current line and the output fluctuation (%) of the current sensor 1 with application of a constant external magnetic field and without application of an external magnetic field, the results being obtained by computer simulation. The current sensor 1 includes eight magnetic sensor units. FIG. 8 demonstrates that the current sensor 1 is not affected by the constant external magnetic field. The reason is that the influence of the external magnetic field can be canceled out by a pair of magnetic sensor elements having the sensitivity axes oriented in opposite directions in each magnetic sensor unit and the plurality of magnetic sensor units. As described above, the current sensor 1 according to the present embodiment is effective in reducing the influence of the external magnetic field and increasing the accuracy of current measurement. In order to substantially cancel out the influence of the external magnetic field, it is desirable that the absolute values of the sensitivities of the two magnetic sensor elements in each magnetic sensor unit be substantially equal to each other.

Figure 9A:
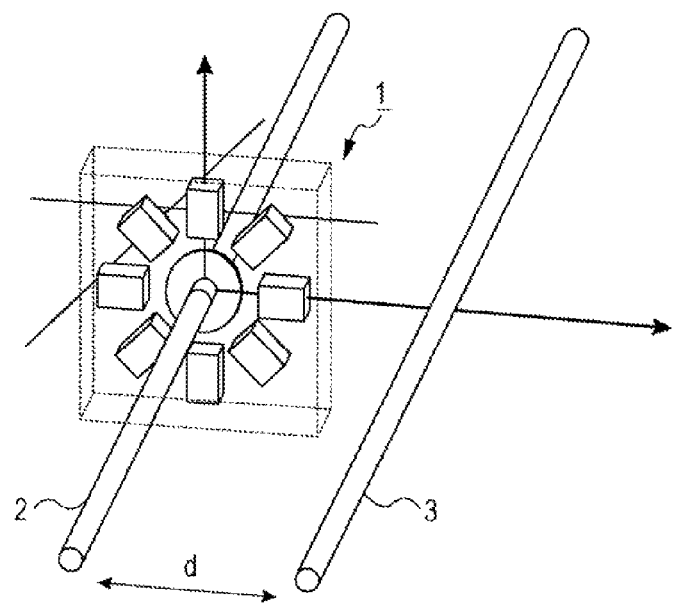
FIG. 9A is a schematic diagram illustrating a state in which another current line is disposed near the current sensor.
Figure 9B:
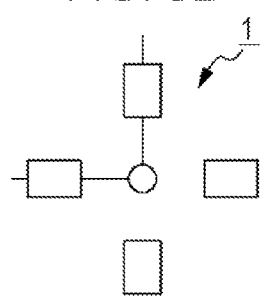
FIGS. 9B to 9D are schematic diagrams of current sensors having different numbers and arrangements of magnetic sensor units.
Figure 9C:
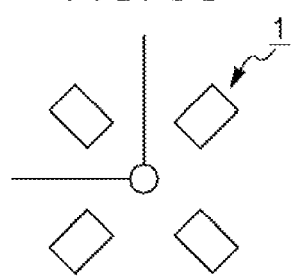
Figure 9D:
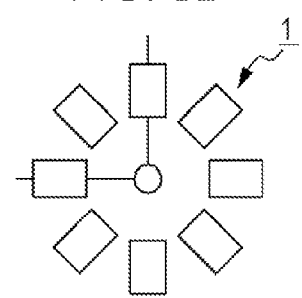

As schematically illustrated in FIG. 9A, it is assumed that another current line 3 is disposed near the current sensor 1 (and the current line 2). The current measurement accuracy of the current sensor 1 upon flow of predetermined current through the current line 3 in this state was obtained by computer simulation. The computer simulation was performed using a parameter indicating the distance, denoted by d, between the current lines 2 and 3 on the current sensors 1 having different numbers and arrangements of magnetic sensor units. Table illustrates the results of simulation as follows. In Table, "4-Sensor A" corresponds to the simulation results for the current sensor 1 including four magnetic sensor units as illustrated in FIG. 9B, "4-Sensor B" corresponds to the simulation results for the current sensor 1 including four magnetic sensor units in another arrangement as illustrated in FIG. 9C, and "8-Sensor" corresponds to the simulation results for the current sensor 1 including eight magnetic sensor units as illustrated in FIG. 9D.

TABLE 1

| Distance d [mm] | Accuracy [%] | | |
|---|---|---|---|
| | 4-Sensor A | 4-Sensor B | 8-Sensor |
| 10 | 6.645 | 5.877 | 0.384 |
| 15 | 1.244 | 1.218 | 0.013 |
| 20 | 0.390 | 0.385 | 0.002 |

In the state illustrated in FIG. 9A, the influence of current flowing through the current line 3 generally becomes a considerable problem. The current sensor 1 according to this embodiment can reduce the influence of the adjacent current line 3 to a greater or lesser extent depending on the number and arrangement of magnetic sensor units. The reason is that the influence of the current line 3 can be canceled out by a pair of magnetic sensor elements having the sensitivity axes oriented in the opposite directions in each magnetic sensor unit and the plurality of magnetic sensor units. Table demonstrates that increasing the number of magnetic sensor units enables the influence of the adjacent current line 3 to be further reduced.

Figure 10A:
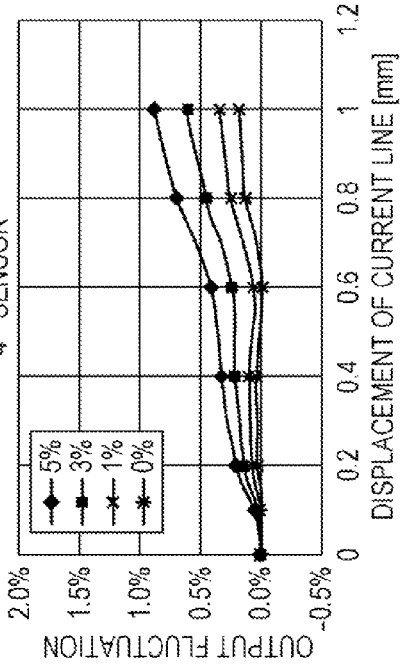
FIGS. 10A and 10B are graphs illustrating the influence of sensitivity variations between the magnetic sensor units.
Figure 10B:
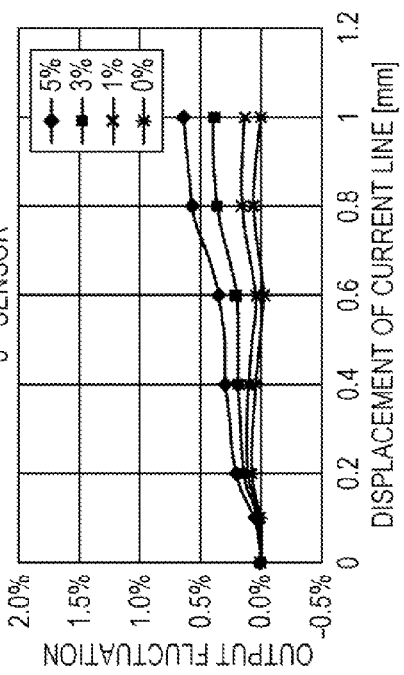
Figure 10C:
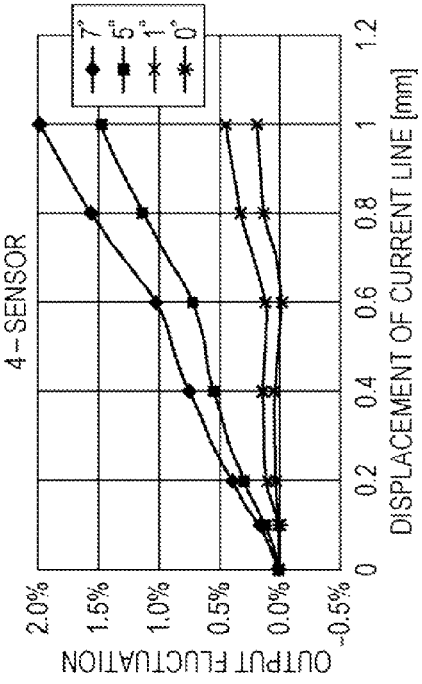
FIGS. 10C and 10D are graphs illustrating the influence of angle variations between the magnetic sensor units.
Figure 10D:
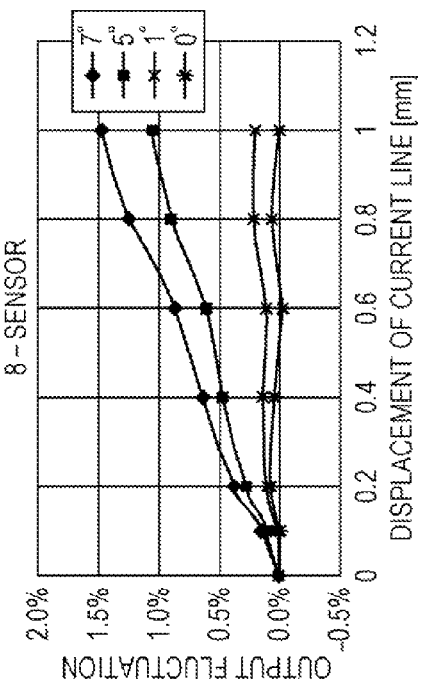

FIGS. 10A to 10D are graphs illustrating the influences of variations in sensitivity and those in angle between the sensor units in current measurement, the results being obtained by computer simulation. FIGS. 10A and 10B illustrate the relationships between the displacement (mm) of the current line and the output fluctuation (%) of the current sensor 1 in sensitivity variations between the magnetic sensor units of 0%, 1%, 3%, and 5%. FIG. 10A illustrates the simulation results in the arrangement of eight magnetic sensor units. FIG. 10B illustrates the simulation results in the arrangement of four magnetic sensor units. FIGS. 10C and 10D illustrate the relationships between the displacement (mm) of the current line and the output fluctuation (%) of the current sensor 1 in angle variations between the sensor units of 0°, 1°, 5°, and 7°. FIG. 10C illustrates the simulation results in the arrangement of eight magnetic sensor units. FIG. 10D illustrates the simulation results in the arrangement of four magnetic sensor units.

The results illustrated in FIGS. 10A to 10D reveal that as the sensitivity variation between the magnetic sensor units or the angle variation between them is smaller, the output fluctuation can be reduced and the current measurement accuracy can therefore be increased. Ideally, it is desirable that the sensor units have the same sensitivity (sensitivity absolute value) and there be no angle variation between the sensor units. Increasing the number of magnetic sensor units is effective in relaxation of the influences of the sensitivity variation and the angle variation.

As described above, in the current sensor according to the present embodiment, the magnetic sensor units are arranged so as to surround the axis where the current line through which the target current flows during current measurement is disposed. Accordingly, an induced magnetic field can be measured along one turn path around the current line. The current can be calculated from the sum of measurements. This configuration enables the influence of displacement relative to the current line on one magnetic sensor unit to be canceled out by the other magnetic sensor units arranged around the axis. Accordingly, if the accuracy of installation of the current sensor relative to the current line is not high, high-accuracy current measurement can be achieved. In other words, the current sensor that maintains high accuracy of current measurement and permits the accuracy of installation relative to a current line through which target current flows to be relaxed can be provided.

The configuration according to the present embodiment may be implemented in combination with a configuration according to another embodiment as appropriate.

Second Embodiment

A second embodiment will be described with respect to a current sensor that includes a plurality of magnetic sensor modules each including a plurality of magnetic sensor units. A detailed description of components equivalent to those in the first embodiment will be omitted.

Figure 11:
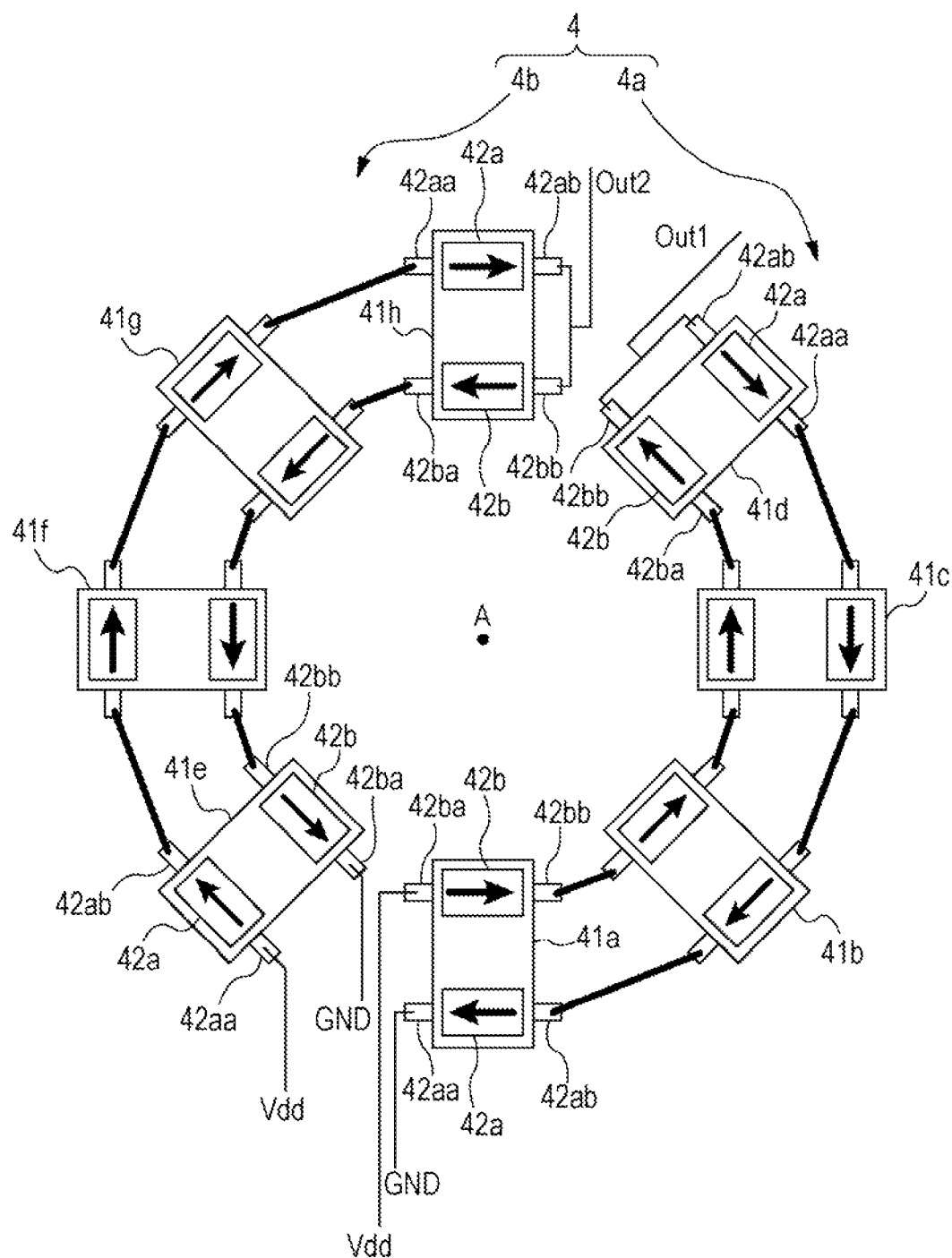
FIG. 11 is a schematic diagram illustrating an exemplary configuration of a current sensor according to a second embodiment.

FIG. 11 is a schematic plan view of a current sensor according to the present embodiment. A current sensor 4 illustrated in FIG. 11 includes a magnetic sensor module 4a including magnetic sensor units 41a, 41b, 41c, and 41d and a magnetic sensor module 4b including magnetic sensor units 41e, 41f, 41g, and 41h, the magnetic sensor units being arranged in positions corresponding to the vertices of a regular octagon in plan view. Although FIG. 11 illustrates a configuration in which eight magnetic sensor units in total are arranged in eight positions corresponding to the vertices of the regular octagon, namely, the eight magnetic sensor units are arranged on concentric circles, the configuration of the current sensor is not limited to this configuration. The number of magnetic sensor units included in the current sensor may be more than one. Furthermore, the magnetic sensor units may be arranged so as to surround at least one point (an axis or center) in plan view. For example, the magnetic sensor units may be arranged on the vertices of a polygon (not limited to a regular polygon) or a circumference in plan view.

In the current sensor 4, a current line (not illustrated) through which target current flows is disposed in the vicinity of a point A (axis A) positioned substantially equidistant from the magnetic sensor units 41a to 41h in plan view such that the current line extends in a direction into the drawing sheet. In other words, assuming that the magnetic sensor units 41a to 41h are projected in a plane perpendicular to a direction in which the target current flows (or the direction in which the current line extends), the magnetic sensor units 41a to 41h are arranged in positions corresponding to the vertices of the regular octagon, the positions being substantially equidistant from the point A (axis A). The point A corresponds to the center of the concentric circles on which the magnetic sensor units 41a to 41h are arranged in plan view. The position of the current line is not limited to this position. In the current sensor 4 according to the present embodiment, requirements for the relative positional relationship between the current line and the current sensor 4 are relaxed. In other words, restrictions on the positional relationship between the current line and the current sensor 4 are reduced, thus increasing the flexibility of arrangement. Accordingly, the current line may be disposed in a position deviated from the point A (axis A). In order to achieve the effect of reducing the influence of displacement, it is desirable that the current line be disposed in an area surrounded by the magnetic sensor units 41a to 41h in plan view.

The magnetic sensor units 41a to 41h may be arranged in any positions in the direction into the drawing sheet. The influence of displacement can be compensated for so long as the above-described positional relationship is established in the plane perpendicular to the direction in which the target current flows. In other words, the arrangement of the magnetic sensor units 41a to 41h is not limited to that in the same plane. For example, the magnetic sensor units 41a to 41h may be arranged spirally about the current line. In the following description, it is assumed that the arrangement of components projected on a plane perpendicular to the direction in which the target current flows is viewed in plan view, except as specially mentioned.

The magnetic sensor units 41a to 41h have the same configuration as each magnetic sensor unit according to the first embodiment. Specifically, the magnetic sensor units 41a to 41h each include a magnetic sensor element (first magnetic sensor element) 42a and a magnetic sensor element (second magnetic sensor element) 42b which have sensitivity axes oriented in opposite directions. The magnetic sensor elements have the same structure as that in the first embodiment.

In the magnetic sensor module 4a of the current sensor 4, the sensitivity axes of the magnetic sensor elements 42a are oriented clockwise along the circumferences of the concentric circles. Furthermore, the sensitivity axes of the magnetic sensor elements 42b are oriented counterclockwise along the circumferences of the concentric circles. Note that the orientations of the sensitivity axes of the magnetic sensor elements 42a and 42b in the magnetic sensor module 4a are not limited to this pattern.

In the magnetic sensor module 4a, a first end (not illustrated) of the magnetic sensor element 42a in the magnetic sensor unit (first magnetic sensor unit) 41a is connected to a terminal 42aa of the magnetic sensor unit 41a. The terminal 42aa is connected to the potential source that applies the ground potential GND. A first end (not illustrated) of the magnetic sensor element 42b in the magnetic sensor unit 41a is connected to a terminal 42ba of the magnetic sensor unit 41a. The terminal 42ba is connected to the potential source that applies the power supply potential Vdd. In the magnetic sensor unit (last magnetic sensor unit) 41d, a second end (not illustrated) of the magnetic sensor element 42a is connected to a terminal 42ab of the magnetic sensor unit 41d. A second end (not illustrated) of the magnetic sensor element 42b is connected to a terminal 42bb of the magnetic sensor unit 41d. The terminals 42ab and 42bb of the magnetic sensor unit 41d are electrically connected to constitute an output terminal that outputs a sensor output Out1.

In the magnetic sensor module 4a, all of the magnetic sensor elements 42a each having the sensitivity axis oriented clockwise are connected in series. In addition, all of the magnetic sensor elements 42b each having the sensitivity axis oriented counterclockwise are connected in series. More specifically, the terminal 42aa in any magnetic sensor unit is electrically connected to the terminal 42ab in the next magnetic sensor unit. In addition, the terminal 42ba in any magnetic sensor unit is electrically connected to the terminal 42bb in the next magnetic sensor unit. Note that the terminals connected to the potential sources and the terminals constituting the output terminal are eliminated from the above-described connection relationship.

Specifically, in the magnetic sensor module 4a, the first end (corresponding to the terminal 42aa) of the magnetic sensor element 42a in the magnetic sensor unit 41a is electrically connected to the first end (corresponding to the terminal 42ba) of the magnetic sensor element 42b in the magnetic sensor unit 41a through the other magnetic sensor units, thus forming a closed circuit. The closed circuit is a half bridge circuit. The half bridge circuit can output a sensor output Out1 indicating a potential that reflects a voltage drop across each magnetic sensor element. Accordingly, the sensor output Out1 that reflects characteristic fluctuations of the magnetic sensor elements caused by an induced magnetic field can be obtained.

In the magnetic sensor module 4b of the current sensor 4, the sensitivity axes of the magnetic sensor elements 42a are oriented clockwise along the circumferences of the concentric circles. Furthermore, the sensitivity axes of the magnetic sensor elements 42b are oriented counterclockwise along the circumferences of the concentric circles. Specifically, the sensitivity axes of the magnetic sensor elements 42a of the magnetic sensor module 4a are oriented in the same direction as those of the magnetic sensor elements 42a of the magnetic sensor module 4b. The sensitivity axes of the magnetic sensor elements 42b of the magnetic sensor module 4a are oriented in the same direction as those of the magnetic sensor elements 42b of the magnetic sensor module 4b. Aligning the sensitivity axes of the magnetic sensor elements in this manner can prevent the occurrence of a difference in magnetic flux density of the applied induced magnetic field between the magnetic sensor modules. Furthermore, since the magnetic sensor units of one type of package structure may be used, the cost of production can be reduced. Note that the orientations of the sensitivity axes of the magnetic sensor elements 42a and 42b are not limited to this pattern.

In the magnetic sensor module 4b, the first end (not illustrated) of the magnetic sensor element 42a in the magnetic sensor unit (first magnetic sensor unit) 41e is connected to the terminal 42aa of the magnetic sensor unit 41e. The terminal 42aa is connected to the potential source that applies the power supply potential Vdd. The first end (not illustrated) of the magnetic sensor element 42b in the magnetic sensor unit 41e is connected to the terminal 42ba of the magnetic sensor unit 41e. The terminal 42ba is connected to the potential source that applies the ground potential GND. In addition, the second end (not illustrated) of the magnetic sensor element 42a in the magnetic sensor unit (last magnetic sensor unit) 41h is connected to the terminal 42ab of the magnetic sensor unit 41h and the second end (not illustrated) of the magnetic sensor element 42b is connected to the terminal 42bb of the magnetic sensor unit 41h. The terminals 42ab and 42bb of the magnetic sensor unit 41h are electrically connected to constitute an output terminal that outputs a sensor output Out2.

In the magnetic sensor module 4b, all of the magnetic sensor elements 42a each having the sensitivity axis oriented clockwise are connected in series. In addition, all of the magnetic sensor elements 42b each having the sensitivity axis oriented counterclockwise are connected in series. More specifically, the terminal 42aa in any magnetic sensor unit is electrically connected to the terminal 42ab in the next magnetic sensor unit. In addition, the terminal 42ba in any magnetic sensor unit is electrically connected to the terminal 42bb in the next magnetic sensor unit. Note that the terminals connected to the potential sources and the terminals constituting the output terminal are eliminated from the above-described connection relationship.

Specifically, in the magnetic sensor module 4b, the first end (corresponding to the terminal 42aa) of the magnetic sensor element 42a in the magnetic sensor unit 41e is electrically connected to the first end (corresponding to the terminal 42ba) of the magnetic sensor element 42b in the magnetic sensor unit 41e through the other magnetic sensor units, thus forming a closed circuit. The closed circuit is a half bridge circuit. The half bridge circuit can output a sensor output Out2 indicating a potential that reflects a voltage drop across each magnetic sensor element. Accordingly, the sensor output Out2 that reflects characteristic fluctuations of the magnetic sensor elements caused by the induced magnetic field can be obtained.

Figure 12:
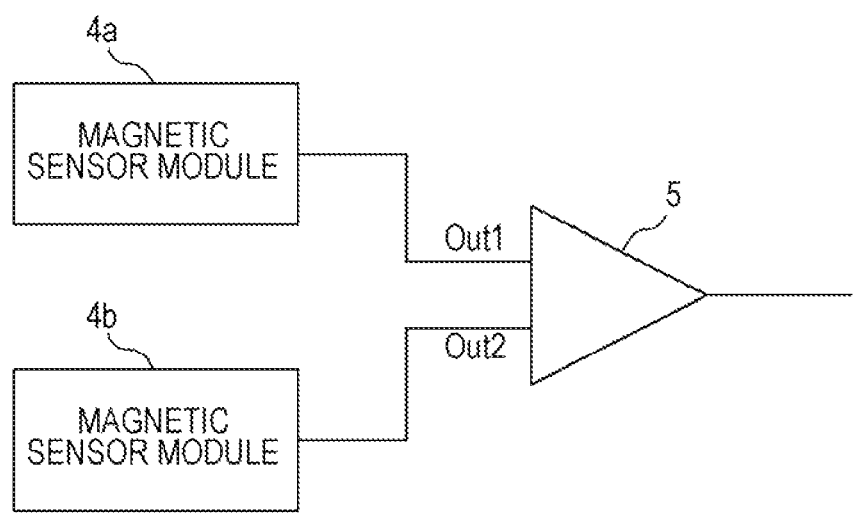
FIG. 12 is a functional block diagram illustrating an exemplary configuration of the current sensor according to the second embodiment.

FIG. 12 is a functional block diagram illustrating an exemplary configuration of the current sensor 4 according to the present embodiment. The magnetic sensor modules 4a and 4b of the current sensor 4 are connected to a differential amplifier 5 that performs a differential operation on outputs of the modules. As described above, in the magnetic sensor module 4a of the current sensor 4, the terminal 42ba of the magnetic sensor element 42b disposed such that its sensitivity axis is oriented counterclockwise is connected to the potential source that applies the power supply potential Vdd and the terminal 42aa of the magnetic sensor element 42a disposed such that its sensitivity axis is oriented clockwise is connected to the potential source that applies the ground potential GND. On the other hand, in the magnetic sensor module 4b, the terminal 42aa of the magnetic sensor element 42a disposed such that its sensitivity axis is oriented clockwise is connected to the potential source that applies the power supply potential Vdd and the terminal 42ba of the magnetic sensor element 42b disposed such that its sensitivity axis is oriented counterclockwise is connected to the potential source that applies the ground potential GND. Since the relationship between the potential sources and the orientations of the sensitivity axes in the magnetic sensor module 4a is the inverse of that in the magnetic sensor module 4b as described above, the outputs Out1 and Out2 in substantially inverse relation to each other with respect to positive and negative signs are derived from the magnetic sensor modules 4a and 4b, respectively. The difference between the outputs Out1 and Out2 is calculated by the differential amplifier 5, so that the target current can be calculated with high accuracy.

The current sensor 4 according to the present embodiment includes the plurality of magnetic sensor units each including the first and second magnetic sensor elements which have sensitivity axes oriented along the circumferences of the concentric circles. Accordingly, the current sensor can measure an induced magnetic field while surrounding the current line through which target current flows during current measurement and calculate the current on the basis of measurements. This configuration enables the influence of displacement relative to the current line on one magnetic sensor unit to be canceled out by the other magnetic sensor units arranged on the concentric circles. Accordingly, if the accuracy of installation of the current sensor relative to the current line is not high, high-accuracy current measurement can be achieved. In other words, the current sensor that maintains high accuracy of current measurement and permits the accuracy of installation relative to a current line through which target current flows to be relaxed can be provided.

Furthermore, the current sensor 4 according to the present embodiment has a full bridge structure as a combination of the two magnetic sensor modules 4a and 4b, each serving as a half bridge circuit. Accordingly, the number of magnetic sensor elements constituting each half bridge circuit and the number of magnetic sensor units constituting the half bridge circuit can be reduced to ½ those of the half bridge circuit according to the first embodiment. Consequently, a voltage drop across each half bridge circuit can be reduced to approximately ½. Advantageously, if a voltage to be applied is reduced to approximately ½, proper current measurement can be achieved.

Figure 13A:
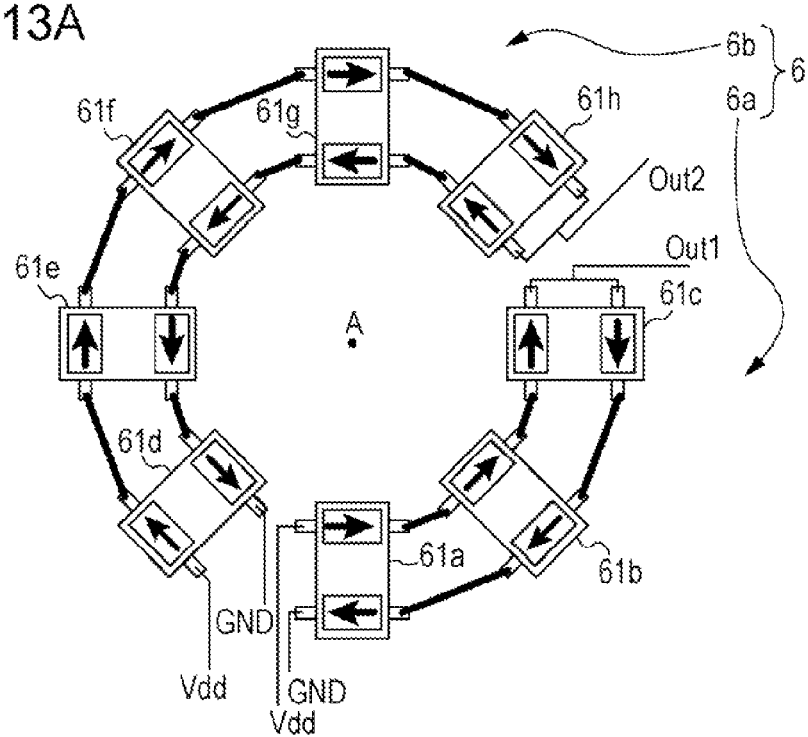
FIGS. 13A and 13B are schematic diagrams illustrating first and second modifications of the current sensor according to the second embodiment.

FIGS. 13A, 13B, 14A, and 14B are schematic views of first to third modifications of the current sensor according to the second embodiment. FIG. 13A illustrates a current sensor 6 according to the first modification. The current sensor 6 includes a magnetic sensor module 6a including magnetic sensor units 61a, 61b, and 61c and a magnetic sensor module 6b including magnetic sensor units 61d, 61e, 61f, 61g, and 61h, the magnetic sensor units being arranged in positions corresponding to the vertices of a regular octagon in plan view. Specifically, the magnetic sensor module 6a includes the three magnetic sensor units and the magnetic sensor module 6b includes the five magnetic sensor units. The magnetic sensor modules include different number of magnetic sensor units. The current sensor 6 has the same configuration as the current sensor 4, except for the number of magnetic sensor units constituting the magnetic sensor module 6a and that constituting the magnetic sensor module 6b.

This current sensor 6 has a full bridge structure as a combination of the two magnetic sensor modules 6a and 6b, each serving as a half bridge circuit. Accordingly, the number of magnetic sensor elements constituting each half bridge circuit and the number of magnetic sensor units constituting the half bridge circuit can be reduced as compared with the half bridge circuit according to the first embodiment. Consequently, a voltage drop across each half bridge circuit can be reduced. Advantageously, if a voltage to be applied is reduced, proper current measurement can be achieved.

Figure 13B:
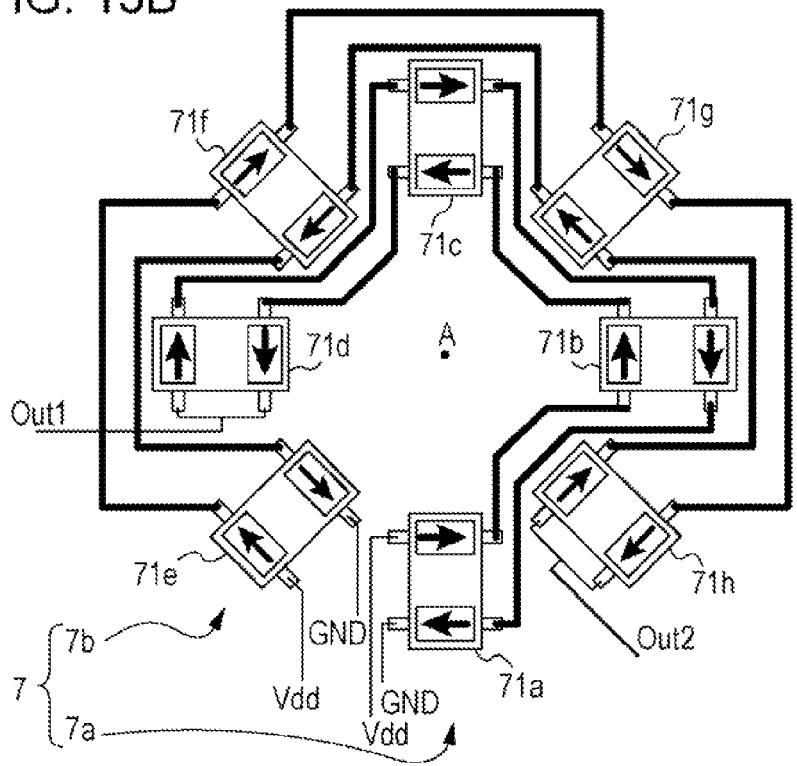

FIG. 13B illustrates a current sensor 7 according to the second modification. The current sensor 7 includes a magnetic sensor module 7a including magnetic sensor units 71a, 71b, 71c, and 71d and a magnetic sensor module 7b including magnetic sensor units 71e, 71f, 71g, and 71h, the magnetic sensor units being arranged in positions corresponding to the vertices of a regular octagon in plan view. In the current sensor 7, the magnetic sensor units constituting the magnetic sensor modules are alternately arranged. More specifically, the magnetic sensor units are arranged on concentric circles counterclockwise in this order of the magnetic sensor units 71a, 71h, 71b, 71g, 71c, 71f, 71d, and 71e. The current sensor 7 has the same configuration as the current sensor 4, except for the arrangement of the magnetic sensor units constituting the magnetic sensor modules 7a and 7b.

This current sensor 7 also has a full bridge structure as a combination of the two magnetic sensor modules 7a and 7b, each serving as a half bridge circuit. Accordingly, the number of magnetic sensor elements constituting each half bridge circuit and the number of magnetic sensor units constituting the half bridge circuit can be reduced to ½ those of the half bridge circuit according to the first embodiment. Consequently, a voltage drop across each half bridge circuit can be reduced to approximately ½. Advantageously, if a voltage to be applied is reduced to approximately ½, proper current measurement can be achieved.

Figure 14A:
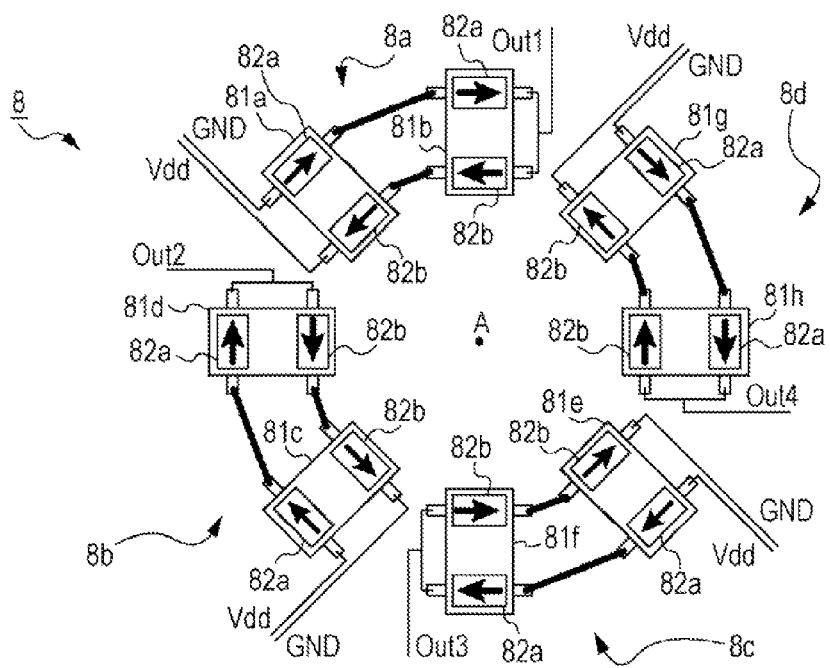
FIG. 14A is a schematic diagram of a third modification of the current sensor according to the second embodiment.

FIG. 14A illustrates a current sensor 8 according to the third modification. The current sensor 8 includes a magnetic sensor module 8a including magnetic sensor units 81a and 81b, a magnetic sensor module 8b including magnetic sensor units 81c and 81d, a magnetic sensor module 8c including magnetic sensor units 81e and 81f, and a magnetic sensor module 8d including magnetic sensor units 81g and 81h, the magnetic sensor units being arranged in positions corresponding to the vertices of a regular octagon in plan view. Specifically, the current sensor 8 includes four magnetic sensor modules each including two magnetic sensor units.

In the current sensor 8, the sensitivity axes of magnetic sensor elements 82a are oriented clockwise along the circumferences of concentric circles. Furthermore, the sensitivity axes of magnetic sensor elements 82b are oriented counterclockwise along the circumferences of the concentric circles. In each of the magnetic sensor modules 8a and 8d, the magnetic sensor element 82b disposed such that its sensitivity axis is oriented counterclockwise is connected to the potential source that applies the power supply potential Vdd and the magnetic sensor element 82a disposed such that its sensitivity axis is oriented clockwise is connected to the potential source that applies the ground potential GND. On the other hand, in each of the magnetic sensor modules 8b and 8c, the magnetic sensor element 82a disposed such that its sensitivity axis is oriented clockwise is connected to the potential source that applies the power supply potential Vdd and the magnetic sensor element 82b disposed such that its sensitivity axis is oriented counterclockwise is connected to the potential source that applies the ground potential GND. In other words, the relationship between the potential sources and the orientations of the sensitivity axes in the magnetic sensor module 8a is the inverse of that in the magnetic sensor module 8b. Furthermore, the relationship between the potential sources and the orientations of the sensitivity axes in the magnetic sensor module 8c is the inverse of that in the magnetic sensor module 8d. In addition, the relationship between the potential sources and the orientations of the sensitivity axes in the magnetic sensor module 8a is the same as that in the magnetic sensor module 8d. Furthermore, the relationship between the potential sources and the orientations of the sensitivity axes in the magnetic sensor module 8b is the same as that in the magnetic sensor module 8c. Note that the orientations of the sensitivity axes of the magnetic sensor elements 82a and 82b are not limited to this pattern.

Figure 14B:
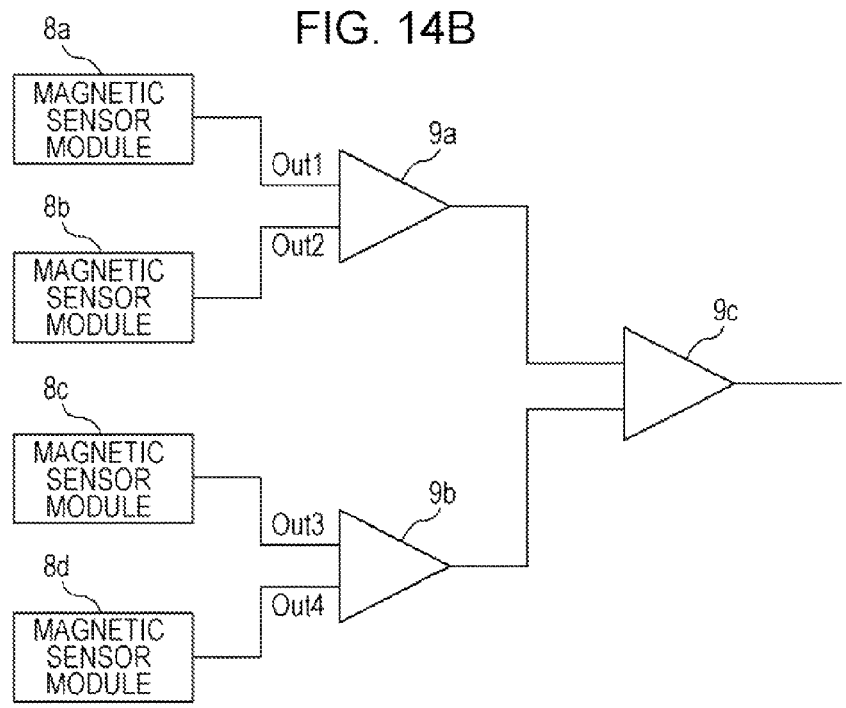
FIG. 14B is a functional block diagram of the third modification.

FIG. 14B is a functional block diagram illustrating an exemplary configuration of the current sensor 8 according to the third modification. The magnetic sensor modules 8a and 8b of the current sensor 8 are connected to a differential amplifier 9a that performs a differential operation on outputs of these modules. The magnetic sensor modules 8c and 8d of the current sensor 8 are connected to a differential amplifier 9b that performs a differential operation on outputs of these modules. Furthermore, the differential amplifiers 9a and 9b are connected to a differential amplifier 9c that performs a differential operation on outputs of these amplifiers. As described above, in the current sensor 8, the relationship between the potential sources and the orientations of the sensitivity axes in the magnetic sensor module 8a is the inverse of that in the magnetic sensor module 8b and the relationship between the potential sources and the orientations of the sensitivity axes in the magnetic sensor module 8c is the inverse of that in the magnetic sensor module 8d. Accordingly, an output Out1 and an output Out2 in substantially inverse relation to each other with respect to positive and negative signs are derived from the magnetic sensor modules 8a and 8b, respectively, and an output Out3 and an output Out4 in substantially inverse relation to each other with respect to the positive and negative signs are derived from the magnetic sensor modules 8c and 8d, respectively.

Furthermore, the relationship between the potential sources and the orientations of the sensitivity axes in the magnetic sensor module 8a is the same as that in the magnetic sensor module 8d and the relationship between the potential sources and the orientations of the sensitivity axes in the magnetic sensor module 8b is the same as that in the magnetic sensor module 8c. Accordingly, the difference between the outputs Out1 and Out2 obtained by the differential amplifier 9a and the difference between the outputs Out3 and Out4 obtained by the differential amplifier 9b are in substantially inverse relation to each other with respect to the positive and negative signs. Consequently, the difference between the outputs Out1 and Out2 and the difference between the outputs Out3 and Out4 are further subjected to a differential operation through the differential amplifier 9c, so that target current can be measured with high accuracy.

This current sensor 8 is configured as a combination of a full bridge structure including the magnetic sensor modules 8a and 8b and a full bridge structure including the magnetic sensor modules 8c and 8d. Accordingly, the number of magnetic sensor elements constituting each magnetic sensor module, serving as a half bridge circuit, and the number of magnetic sensor units constituting the magnetic sensor module can be reduced to ¼ those of the half bridge circuit according to the first embodiment. Consequently, a voltage drop across each half bridge circuit can be reduced to approximately ¼. Advantageously, if a voltage to be applied is reduced to approximately ¼, proper current measurement can be achieved.

The configuration according to any of the second embodiment and the first to third modifications may be implemented in combination with the configuration of the other embodiment as appropriate.

As described above, since each current sensor according to the second embodiment includes the plurality of magnetic sensor units each including the first and second magnetic sensor elements which have sensitivity axes oriented along the circumferences of the concentric circles, the current sensor can measure an induced magnetic field while surrounding a current line through which target current flows during current measurement and calculate the current on the basis of measurements. This configuration enables the influence of displacement relative to the current line on one magnetic sensor unit to be canceled out by the other magnetic sensor units arranged on the concentric circles. Accordingly, if the accuracy of installation of the current sensor relative to the current line is not high, high-accuracy current measurement can be achieved. In other words, the current sensor that maintains high accuracy of current measurement and permits the accuracy of installation relative to a current line through which target current flows to be relaxed can be provided.

The present invention is not limited to the above-described embodiments and various modifications may be made. For example, the connection relationship between elements and the size of each element in the above-described embodiments may be appropriately changed without departing from the spirit of the invention. In addition, the configurations, methods, and the like described in the foregoing embodiments may be combined and implemented as appropriate. Furthermore, the present invention may be appropriately modified and implemented within the scope of the present invention.

The current sensor according to any of the embodiments permits requirements for the accuracy of installation to be relaxed and can therefore be used as a general-purpose current sensor which can be installed relative to any current line.

What is claimed is:

1. A current sensor comprising:
a magnetic sensor module formed of a plurality of magnetic sensor units connected one another, the plurality of magnetic sensor units including a first magnetic sensor unit at an end of the magnetic sensor module and a last magnetic sensor unit at another end of the magnetic sensor module, each of the plurality of magnetic sensor units including:
a first magnetic sensor element having a sensitivity axis in a first direction, the first magnetic sensor element having a first end and a second end;
a second magnetic sensor element having a sensitivity axis in a second direction opposite to the first direction, the second magnetic sensor element having a first end and a second end;
a first terminal connected to the first end of the first magnetic sensor element;
a second terminal connected to the second end of the first magnetic sensor element;
a third terminal connected to the first end of the second magnetic sensor element; and
a fourth terminal connected to the second end of the second magnetic sensor element,
wherein the first terminal of the first magnetic sensor unit is connected to a first potential source, and the third terminal of the first magnetic sensor unit is connected to a second potential source,
wherein the second terminal and the fourth terminal of the last magnetic sensor unit are connected to each other to constitute a sensor output terminal,
wherein the first and third terminals of each of the plurality of magnetic sensor units excluding the first magnetic sensor unit is connected to the second and fourth terminals of an adjacent magnetic sensor unit next thereto on the first magnetic sensor unit side,
wherein the first magnetic sensor elements of the plurality of magnetic sensor units are electrically connected to one another in series, and the second magnetic sensor elements of the plurality of magnetic sensor units are electrically connected to one another in series,
and wherein the plurality of magnetic sensor units are arranged such that the respective sensitivity axes of the first and second magnetic sensor elements are disposed along circumferences of concentric circles.

2. The current sensor according to claim 1, wherein the current sensor comprises a single magnetic sensor module including the plurality of magnetic sensor units equiangularly spaced with respect to a center of the concentric circles.

3. The current sensor according to claim 2, wherein the single magnetic sensor module includes four or more magnetic sensor units.

4. The current sensor according to claim 2, wherein the single magnetic sensor module includes an even number of magnetic sensor units.

5. The current sensor according to claim 1, wherein the current sensor comprises a plurality of magnetic sensor modules each including the plurality of magnetic sensor units equiangularly spaced with respect to a center of the concentric circles.

6. The current sensor according to claim 5, wherein a total number of magnetic sensor units included in the plurality of magnetic sensor modules is equal to or greater than four.

7. The current sensor according to claim 5, wherein a total number of magnetic sensor units included in the plurality of magnetic sensor modules is an even number.

8. The current sensor according to claim 1, wherein the plurality of magnetic sensor units are arranged along a same circle.

9. The current sensor according to claim 1, wherein the first magnetic sensor element and the second magnetic sensor element in each magnetic sensor unit have respective magnetic sensitivities having substantially the same absolute value.

10. The current sensor according to claim 1, wherein each of the plurality of magnetic sensor units has a single chip structure such that the first magnetic sensor element and the second magnetic sensor element are disposed on a single substrate.

11. The current sensor according to claim 1, wherein each of the first and second magnetic sensor elements is formed of a GMR element.

12. The current sensor according to claim 1, wherein a current line through which a target current flows is disposed at a center of the concentric circles.

* * * * *